(12) United States Patent
Resnick et al.

(10) Patent No.: US 6,517,977 B2
(45) Date of Patent: Feb. 11, 2003

(54) LITHOGRAPHIC TEMPLATE AND METHOD OF FORMATION AND USE

(75) Inventors: Doug J. Resnick, Phoenix, AZ (US); Kevin J. Nordquist, Higley, AZ (US)

(73) Assignee: Motorola, Inc., Schaumburg, IL (US)

( * ) Notice: Subject to any disclaimer, the term of this patent is extended or adjusted under 35 U.S.C. 154(b) by 104 days.

(21) Appl. No.: 09/819,388

(22) Filed: Mar. 28, 2001

(65) Prior Publication Data

US 2002/0142229 A1 Oct. 3, 2002

(51) Int. Cl.[7] .............................. G03F 9/00; G03F 7/00
(52) U.S. Cl. ........................ 430/5; 430/302; 430/309; 430/310; 430/311
(58) Field of Search ........................ 430/5, 302, 309, 430/310, 311

(56) References Cited

U.S. PATENT DOCUMENTS 6,387,787 B1 * 5/2002 Mancini et al. ............. 438/586

* cited by examiner

Primary Examiner—Christopher G. Young
(74) Attorney, Agent, or Firm—William E. Koch

(57) ABSTRACT

This invention relates to semiconductor devices, microelectronic devices, micro electro mechanical devices, microfluidic devices, and more particularly to a lithographic template, a method of forming the lithographic template and a method for forming devices with the lithographic template. The lithographic template (20, 30, 42) is formed having a substrate (22, 32) and a template pedestal (24, 34) having formed thereon an uppermost surface an etched pattern or relief image (26, 36, 48). The template (20, 30, 42) is used in the fabrication of a semiconductor device (44) for affecting a pattern in the device (44) by positioning the template (20, 30, 42) in close proximity to semiconductor device (44) having a radiation sensitive material (50) formed thereon and applying a pressure (52) to cause the radiation sensitive material (50) to flow into the relief image (48) present on the template (42). Radiation (53) is then applied through the template (42) so as to further cure portions of the radiation sensitive material (50) and further define the pattern in the radiation sensitive material (50). The template (20, 30, 42) is then removed to complete fabrication of semiconductor device (44).

18 Claims, 4 Drawing Sheets

LITHOGRAPHIC TEMPLATE AND METHOD OF FORMATION AND USE

FIELD OF THE INVENTION

The present invention relates to semiconductor devices, microelectronic devices, micro-electro mechanical devices, microfluidic devices, and more particularly to a lithographic template, a method of forming the lithographic template and a method for forming these devices with the lithographic template.

BACKGROUND OF THE INVENTION

The fabrication of integrated circuits involves the creation of several layers of materials that interact in some fashion. One or more of these layers may be patterned so various regions of the layer have different electrical characteristics, which may be interconnected within the layer or to other layers to create electrical components and circuits. These regions may be created by selectively introducing or removing various materials. The patterns that define such regions are often created by lithographic processes. For example, a layer of photoresist material is applied onto a layer overlying a wafer substrate. A photomask (containing clear and opaque areas) is used to selectively expose this photoresist material by a form of radiation, such as ultraviolet light, electrons, or x-rays. Either the photoresist material exposed to the radiation, or that not exposed to the radiation, is removed by the application of a developer. An etch may then be applied to the layer not protected by the remaining resist, and when the resist is removed, the layer overlying the substrate is patterned.

Lithographic processes such as that described above are typically used to transfer patterns from a photomask to a device. As feature sizes on semiconductor devices decrease into the submicron range, there is a need for new lithographic processes, or techniques, to pattern high density semiconductor devices. Several new lithographic techniques which accomplish this need and have a basis in imprinting and stamping have been proposed. One in particular, Step and Flash Imprint Lithography (SFIL), has been shown to be capable of patterning lines as small as 60 nm.

SFIL templates are typically made by applying a layer of chrome, 80–400 nm thick, onto a transparent quartz plate. A resist layer is applied to the chrome and patterned using either an electron beam or optical exposure system. The resist is then placed in a developer to form patterns on the chrome layer. The resist is used as a mask to etch the chrome layer. The chrome then serves as a hard mask for the etching of the quartz plate. Finally, the chrome is removed, thereby forming a quartz template containing relief images in the quartz.

Overall, SFIL techniques benefit from their unique use of photochemistry, ambient temperature processing, and the low contact pressure required to carry out the SFIL process. During a typical SFIL process, a substrate is coated with an organic planarization layer, and brought into close proximity of a transparent SFIL template, typically comprised of quartz, containing a relief image and coated with a low surface energy material. An ultraviolet or deep ultraviolet sensitive photocurable organic solution is deposited between the template and the coated substrate. Using minimal pressure, the template is brought into contact with the substrate, and more particularly the photocurable organic layer. Next, the organic layer is cured, or crosslinked, at room temperature by photoillumination through the template. The light source typically uses ultraviolet radiation. A range of wavelengths (150 nm–500 nm) is possible, depending upon the transmissive properties of the template and photosensitivity of the photocurable organic. The template is next separated from the substrate and the organic layer, leaving behind an organic replica of the template relief on the planarization layer. This pattern is then etched with a short halogen breakthrough, followed by an oxygen reactive ion etch (RIE) to form a high resolution, high aspect-ratio feature in the organic layer and planarization layer.

The distinction between a lithographic mask and a lithographic template should be noted. A lithographic mask is used as a stencil to impart an aerial image of light into a photoresist material. A lithographic template has a relief image etched into its surface, creating a form or mold. During SFIL, a pattern is defined when a photocurable liquid flows into the relief image and is subsequently cured. During standard imprint lithography, a pattern is defined when a material present on the surface of a substrate material deforms in response to pressure exerted thereupon. The attributes necessary for masks and templates, therefore are quite different.

SFIL technology has been demonstrated to resolve features as small as 60 nm. As such, a wide variety of feature sizes may be drawn on a single wafer. Certain problems exist though with this SFIL template fabrication methodology. In particular, problems exist with respect to incorporating the template fabrication into existing lithographic equipment and handlers. Typical template fabrication for SFIL requires the cutting of a standard 6"×6"×0.250" photomask, or template material, into 1" squares. It is well known that this cutting procedure causes a significant amount of contamination of the actual template end product. In addition, this methodology requires the utilization of non-standard equipment for testing, handling, inspection and repair, which adds expense and complexity to the fabrication process. Once the template has been formed, it is mounted for use in a carrier as is generally indicated in FIG. 1, referenced prior art. More specifically, illustrated is a template 10, including a patterned portion 11, which is mounted into a carrier 12, in which a force, typically a compression force, illustrated by arrows 14, is applied to the exterior vertical aspects of the template by carrier 12. The template 10 is held in place by this carrier 12 and force 14 relative to a substrate wafer 16, and utilized to accomplish SFIL.

As previously stated, this 1" template format precludes the use of standard photomask inspection equipment and cleaning of the equipment once template 10 has been cut. This preclusion is caused by the fact that standard photomask equipment utilizes a larger format, typically in a range of 3" to 9", with a most common embodment ranging from 5"–6". The template periphery is typically rectangular in shape, however a circular or round format can also be used and may contain a flat, notch or the like formed in or on a peripheral surface for alignment purposes. In addition, special carrier device 12 required for mounting template 10 for use due to its uncommon format of 1" square, causes distortion in patterned portion 11 of the template due to the necessary compression force 14 required for mounting within carrier device 12. Accordingly, it would be beneficial to improve upon a template for use in lithography processes in which a template is fabricated so as to conform with standard photomask equipment present in the industry.

It is a purpose of the present invention to provide for an improved lithographic template, a method of fabricating the improved lithographic template, and a method for making devices with the improved lithographic template in which standard handling and inspection equipment now present in the field is able to be utilized.

It is yet another purpose of the present invention to provide for an improved lithographic template, a method of fabricating the improved lithographic template, and a method for making devices with the improved lithographic template in which improvement in the template provides for higher throughput and cost effectiveness.

SUMMARY OF THE INVENTION

This invention relates to semiconductor devices, microelectronic devices, micro electro mechanical devices, microfluidic devices, and more particularly to a lithographic template, a method of forming the lithographic template and a method for forming devices with the lithographic template. Disclosed is a lithographic template including a planar material having formed as a part thereof a template pedestal having formed therein an uppermost surface a relief image. The template is formed by providing a substrate, the substrate having an uppermost surface and having defined therein the uppermost surface a template pedestal, wherein an etched pattern is formed on an uppermost surface of the template pedestal. Additionally, disclosed is a method for making a device with the lithographic template as provided, including the steps of providing a substrate, coating the substrate with a deformable material, providing a lithographic template as previously disclosed, positioning the lithographic template in contact with the deformable material, applying pressure to the template so that a pattern is created in the deformable material, optionally transmitting radiation through the lithographic template to expose at least a portion of the deformable material on the substrate, thereby further affecting the pattern in the deformable material, and removing the template from the substrate.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the drawings, in which.

Figure 1:
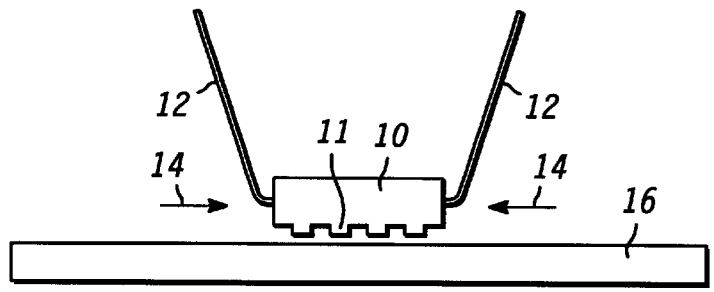
FIG. 1 illustrates in simplified cross-sectional view a method of forming a device utilizing step and flash lithography as is known in the art.

It will be appreciated that for simplicity and clarity of illustration, elements illustrated in the drawings have not necessarily been drawn to scale. For example, the dimensions of some of the elements are exaggerated relative to other elements for purposes of clarity. Furthermore, where considered appropriate, reference numerals have been repeated among the drawings to indicate corresponding or analogous elements.

DESCRIPTION OF THE PREFERRED EMBODIMENT

Figure 2:
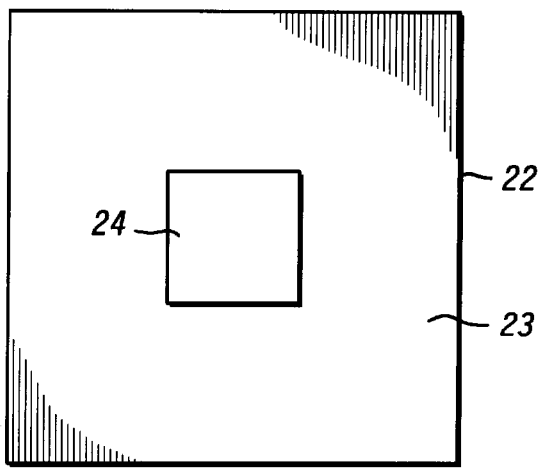
FIGS. 2–4 illustrate in simplified cross-sectional views, process steps for fabricating a lithographic template in accordance with a first embodiment of the present invention.
Figure 4:
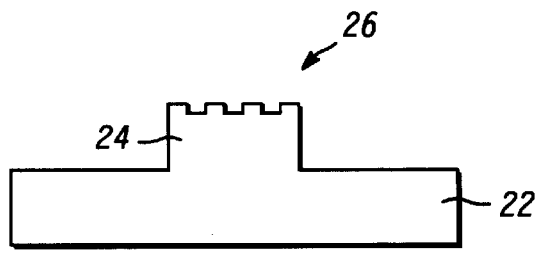

The present invention relates to the improvement of a template that will be able to utilize known photomask handling equipment, such as cleaning and inspection equipment, yet still allow for a template appropriate for use standard imprint lithography as well as SFIL for producing patterns in semiconductor devices. Referring to FIGS. 2 4, illustrated in simplified cross-sectional views, are a plurality of process steps for fabricating a first embodiment of a lithographic template according to the present invention. Referring more specifically to FIG. 2, illustrated is a first step in the process of fabricating a lithographic template 20 according to the present invention. More specifically, illustrated is substrate 22, having a surface 23. Substrate 22 is disclosed as being comprised of a transparent material, such as a quartz material, a polycarbonate material, a pyrex material, a sapphire material, a calcium fluoride ($CaF_2$) material, a magnesium fluoride material ($MgF_2$), or any other similar type of material, that is transparent to light. Substrate 22 is formed of a transparent material to allow for the passage therethrough of light. As illustrated in FIG. 2, substrate 22 has formed as a part thereof, a template pedestal 24. Template pedestal 24 in this particular embodiment is formed as an integrated part of substrate 22 in that substrate 22 is etched during the fabrication process to form template pedestal 24, or alternatively, fabricated during a molding step, etc. As illustrated, in this embodiment, template pedestal 24 is integrally formed with substrate 22, by etching or molding substrate 22. It is additionally anticipated by this disclosure, that template pedestal 24 can be formed as a separate component that is adhered to surface 23 of substrate 22.

Figure 3:
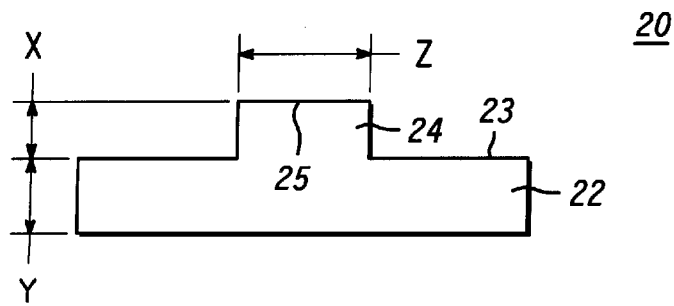

Referring now to FIG. 3, illustrated is substrate 22, having defined on uppermost surface 23, template pedestal 24. As illustrated, template pedestal 24 is formed to protrude from surface 23 of substrate 22. Template pedestal has formed an uppermost surface 25. As illustrated, template 20 has defined dimensions "x", "y", and "z". Dimension "x" as illustrated defines the height of template pedestal 24 from surface 23 of substrate 22. Dimension "y" as illustrated defines the thickness of substrate 22. Dimension "z" as illustrated defines the overall width dimension of template pedestal 24, which in turn will correlate to the patterned area, or relief image, formed on surface 25 of template pedestal 24. It is disclosed that dimension "x" would need to be of a sufficient dimensional depth to allow for a carrier device, similar to that now used in the industry, to grasp template 20 during SFIL. Dimension "y" would need to be of a sufficient dimensional thickness to ensure rigidity of template 20 during the SFIL process. It is anticipated that dimension "z" will vary dependent upon the die area, or patterned area, required for printing on a wafer during SFIL.

Referring now to FIG. 4, a relief image, or etched pattern, 26 is formed on uppermost surface 25 of template pedestal 24. Etched pattern 26 is formed using well known patterning techniques. Typically, a layer of chrome, 80–100 nm thick, is deposited on to a transparent quartz plate. A resist layer is applied to the chrome and patterned using either an electron beam or optical exposure system. The resist is then placed in a developer to form patterns on the chrome layer. The resist is used as a mask to etch the chrome layer. The chrome then serves as a hard mask for the etching of the quartz plate. Finally, the chrome is removed, thereby forming a quartz template containing relief images in the quartz.

Figure 5:
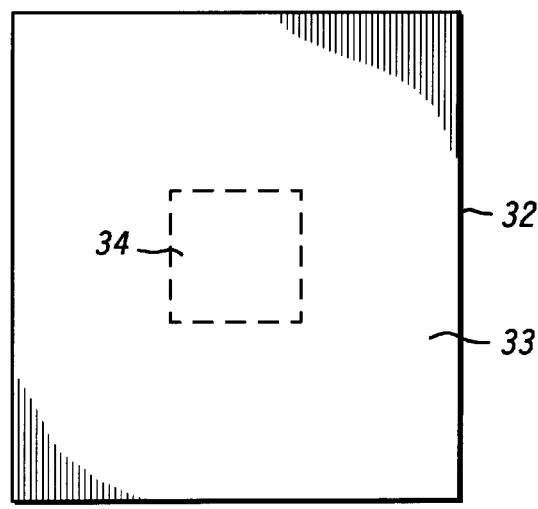
FIGS. 5–7 illustrate in simplified cross-sectional view, process steps for fabricating a lithographic template in accordance with a second embodiment of the present invention.
Figure 6:
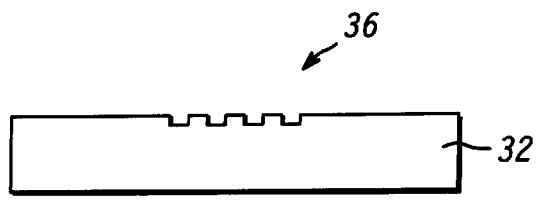
Figure 7:
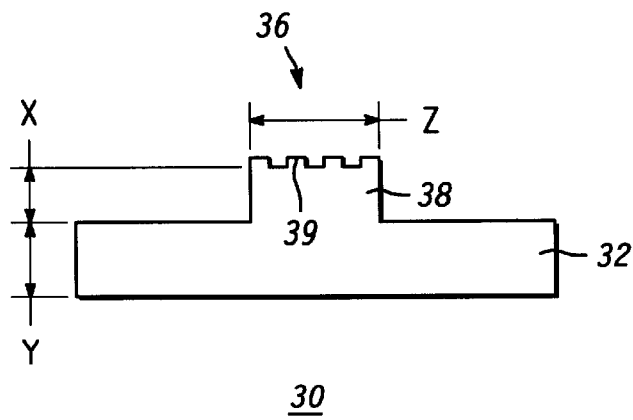
Figure 8:
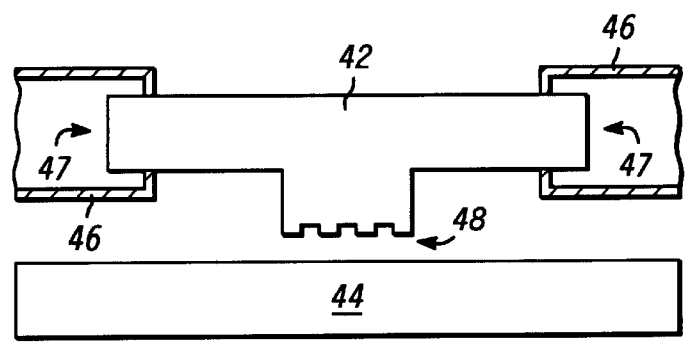
FIGS. 8–11 illustrate in simplified cross-sectional views, process steps for fabricating a semiconductor device with a lithographic template in accordance with the present invention.

Referring now to FIGS. 5–7, illustrated in simplified cross-sectional views are a plurality of process steps for fabricating a second embodiment of a lithographic template according to the present invention. Referring more specifically to FIG. 5, illustrated is a first step in the process of fabricating a lithographic template 30 according to the present invention. More specifically, illustrated is substrate 32, having a surface 33. Substrate 32 is disclosed as being comprised of a transparent material, such as a quartz material, a polycarbonate material, a pyrex material, a calcium fluoride ($CaF_2$) material, a magnesium fluoride material ($MgF_2$), or any other similar type of material, that is transparent to light. Substrate 32 is formed of a transparent material to allow for the passage therethrough of light. Substrate 32 has formed on a surface thereof, a patterned resist layer 34. Patterning resist layer 34 in this particular embodiment is formed on surface 33 of substrate 32 as illustrated in FIG. 5. More specifically, during fabrication, patterned resist layer 34 is formed on a portion of the surface of the substrate that is to be patterned. During fabrication, the portion of substrate 32 underlying the patterned resist layer 34 is etched, thereby defining an etched pattern 36 on a portion of substrate 32 as illustrated in FIG. 6. Referring now to FIG. 7, substrate 32 is etched to define a template pedestal 38, having formed thereon an uppermost surface 39, etched pattern, or relief image, 36. As previously described with respect to FIG. 3, template 30 has similar dimensions "x", "y", and "z", having similar dimensional characteristics for rigidity, etc.

Referring now to FIGS. 8–11, illustrated are process steps wherein a lithographic template, generally similar to template 20 or 30 of FIGS. 2–7, fabricated in accordance with the present invention is used to fabricate a semiconductor device 40. It should be understood that while the manufacturing of a semiconductor device is described with respect to FIGS. 8–11, that the manufacture of microelectronic devices micro-electro mechanical devices, and microfluidic devices is anticipated by this disclosure.

Figure 9:
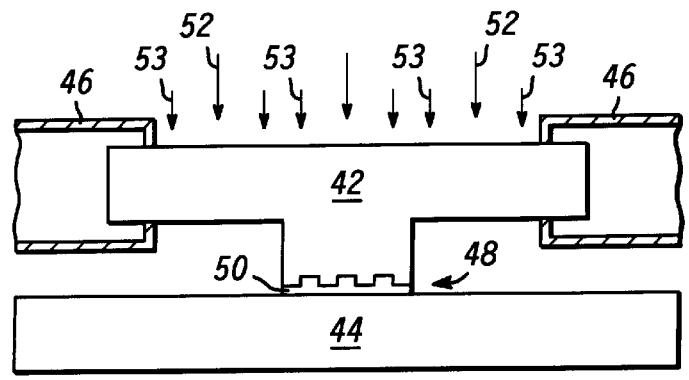
Figure 10:
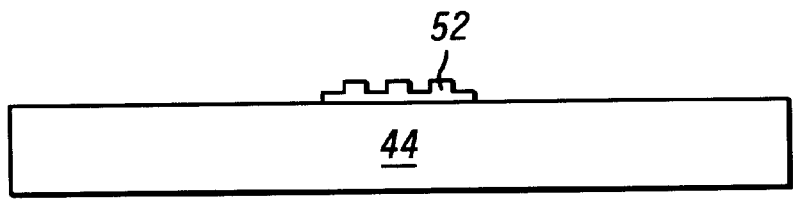
Figure 11:
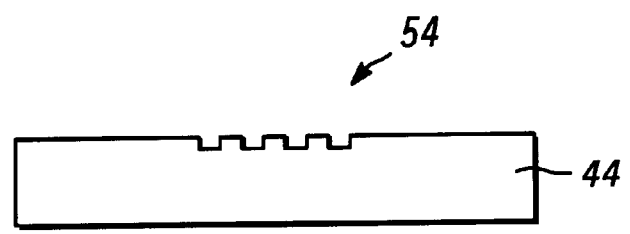

Initially, a semiconductor substrate 44 is provided. Semiconductor substrate is coated with a material layer 50 that is characterized as deformable in response to a pressure exerted thereupon. In the instance where standard imprint lithography is utilized, material layer 50 is generally formed of any standard resist material, well known in the art. Alternatively, as illustrated in this particular embodiment, where SFIL techniques are utilized, material layer 50 is disclosed as being a radiation sensitive material, such as a photocurable organic layer or a photoresist layer. Semiconductor substrate 44 may have overlying devices or device layer such as polysilicon, oxide, metal, etc., as well as trench and diffusion regions or the like. A lithographic template 42 is fabricated in accordance with the description given for FIGS. 2–4 or FIGS. 5–7. As illustrated, lithographic template 42 has formed therein a surface an etched pattern, or relief image, 48. Radiation sensitive material layer 50 coated semiconductor substrate 44 is then placed adjacent to lithographic template 42 as illustrated in FIG. 9. As illustrated, template 42 is held in place by a carrier device 46. Carrier device 46 is positioned to grasp an exterior aspect 47 of template 42, thereby providing for clearance of carrier device 46 during the SRL process. Next, as illustrated in FIG. 9, a slight pressure 52 is applied to template 42 so that radiation sensitive material layer 50 Is flows into relief images 48 on template 42. Radiation 53 is then transmitted through lithographic template 42, and imaged onto the radiation sensitive material layer 50 coated semiconductor substrate 44 to further define and expose a pattern in the radiation sensitive material layer 50. It should be understood that in the instance where standard imprint lithography is pursued, the radiation step is eliminated. Template 42 is thereafter removed from the semiconductor device 44 as illustrated in FIG. 10, thereby leaving a patterned organic layer 52 which is then used as an image layer for subsequent processing. The patterned organic layer 52 can then be used as a mask, either in conjunction with ion implantation to form implanted regions in semiconductor substrate 44, or can be used in conjunction with conventional wet or dry etches to transfer a pattern 54 into semiconductor substrate 44, or into device layers (not shown) overlying semiconductor substrate 44 as illustrated in FIG. 11. Subsequent to the patterning 54 of semiconductor substrate 44, patterned organic layer 52 is removed. It should be understood that although the template fabricated in accordance with the present invention is described in the preferred embodiment as being used to fabricate a semiconductor device, that anticipated is the use of a template, generally similar to template 20 or 30 of FIGS. 2–7, to form microelectronic devices, micro electro mechanical devices, and microfluidic devices.

The foregoing description and illustrations contained herein demonstrate many of the advantages associated with the present invention. In particular, the present invention provides for the improvement in a template design that allows for its use in conjunction with standard lithographic handling and testing equipment.

Thus it is apparent that there has been provided, in accordance with the invention, a lithographic template, and a method of its formation and use that fully meets the need and advantages set forth previously. Although the invention has been described and illustrated with reference to specific embodiments thereof, it is not intended that the invention be limited to these illustrative embodiments. Those skilled in the art will recognize that modifications and variations can be made without departing from the spirit of the invention. Therefore, it is intended that this invention encompass all such variations and modifications as fall within the scope of the appended claims.

We claim:

1. A method of forming a lithographic template comprising the steps of:

providing a substrate, the substrate having an uppermost surface and having defined thereon the uppermost surface a template pedestal, wherein an etched pattern is formed on an uppermost surface of the template pedestal.

2. A method of forming a lithographic template as claimed in claim 1, wherein the step of providing a substrate is further characterized as providing a substrate that is one of rectangular in shape, circular in shape, circular in shape including a flat formed on a peripheral surface for alignment purposes, or circular in shape including a notch formed on a peripheral surface for alignment purposes.

3. A method for forming a lithographic template as claimed in claim 1, wherein the step of providing a substrate is further characterized as providing a substrate of one of an opaque material or a transparent material.

4. A method of forming a lithographic template as claimed in claim 3 wherein the step of providing a substrate having an uppermost surface and having defined thereon an uppermost surface a template pedestal, wherein an etched pattern is formed on an uppermost surface of the template pedestal includes the steps of:

etching the substrate to form a template pedestal;

forming a patterned resist layer on the uppermost surface of the template pedestal;

etching the uppermost surface of the template pedestal, thereby defining an etched pattern on the uppermost surface of the template pedestal; and removing the patterned resist layer.

5. A method of forming a lithographic template as claimed in claim 3 wherein the step of providing a substrate having an uppermost surface and having defined thereon an uppermost surface a template pedestal, wherein an etched pattern is formed on an uppermost surface of the template pedestal includes the steps of:

providing a substrate having a surface;

forming a patterned resist layer on a portion of the surface of the substrate;

etching the portion of the substrate underlying the patterned resist layer, thereby defining an etched pattern on the portion of the substrate;

etching the substrate to define a template pedestal, having formed there on an uppermost surface, the etched pattern.

6. A lithographic template comprising:

a substrate having a surface; and a template pedestal formed on the surface of the substrate and having defined therein an uppermost surface a relief image.

7. A method of forming a lithographic template as claimed in claim 6, wherein the substrate is further characterized as one of rectangular in shape, circular in shape, circular in shape including a flat formed on a peripheral surface for alignment purposes, or circular in shape including a notch formed on a peripheral surface for alignment purposes.

8. A lithographic template as claimed in claim 6, wherein the substrate is formed as one of a transparent substrate or an opaque substrate.

9. A lithographic template as claimed in claim 8, wherein the transparent substrate is further characterized as one of a quartz material, a polycarbonate material, a calcium fluoride ($CaF_2$) material, a magnesium fluoride ($MgF_2$) material, or a pyrex material.

10. A lithographic template as claimed in claim 8, wherein the template pedestal is integrally formed with the substrate.

11. A lithographic template as claimed in claim 8, wherein the template pedestal is formed to protrude from the surface of the substrate.

12. A method for making a device comprising the steps of:

providing a substrate;

coating the substrate with a material layer characterized as deformable in response to a pressure applied thereto;

fabricating a lithographic template, wherein the lithographic template comprises;

a substrate having a surface; and a template pedestal formed on the surface of the substrate and having defined therein an uppermost surface a relief image;

positioning the lithographic template in contact with the material layer, the material layer being between the template and the substrate;

applying pressure to the template, the material layer thereby deforming into the relief pattern on the template; and removing the template from the substrate.

13. A method for making a device as claimed in claim 12, wherein the material layer is a radiation sensitive material layer.

14. A method for making a device as claimed in claim 13 wherein the radiation sensitive material layer is further characterized as coating the substrate with a photocurable material layer.

15. A method for making a device as claimed in claim 13, further including the step of transmitting radiation through the lithographic template to expose at least a portion of the radiation sensitive material layer on the substrate, thereby further affecting the pattern in the radiation sensitive material layer.

16. A method for making a device as claimed in claim 15, wherein the step of transmitting radiation through the lithographic template is further characterized as transmitting ultraviolet light through the lithographic template.

17. A method for making a device as claimed in claim 15, wherein the step of transmitting radiation through the lithographic template is further characterized as transmitting deep ultraviolet light through the lithographic template.

18. A method for making a device as claimed in claim 12 wherein the device is one of a semiconductor device, a microelectronic device, a micro electro mechanical device, or a microfluidic device.

* * * * *